(12) United States Patent
Zhuo

(10) Patent No.: US 12,280,947 B2
(45) Date of Patent: Apr. 22, 2025

(54) OVERHEAD TRAVELING VEHICLE AND OVERHEAD TRAVELING VEHICLE FAULT PROCESSING SYSTEM

(71) Applicant: CHANGXIN MEMORY TECHNOLOGIES, INC., Hefei (CN)

(72) Inventor: Fei Zhuo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 878 days.

(21) Appl. No.: 17/486,437

(22) Filed: Sep. 27, 2021

(65) Prior Publication Data

US 2022/0055835 A1 Feb. 24, 2022

Related U.S. Application Data

(63) Continuation of application No. PCT/CN2021/103830, filed on Jun. 30, 2021.

(30) Foreign Application Priority Data

Aug. 21, 2020 (CN) .......................... 202010848948.8

(51) Int. Cl.
*B65G 1/04* (2006.01)
*B65G 43/04* (2006.01)
*B66C 11/04* (2006.01)

(52) U.S. Cl.
CPC ........... *B65G 1/0457* (2013.01); *B65G 43/04* (2013.01); *B66C 11/04* (2013.01)

(58) Field of Classification Search
CPC ........ B66C 11/04; B65G 1/0457; B65G 43/04
See application file for complete search history.

(56) References Cited

U.S. PATENT DOCUMENTS 6,092,678 A 7/2000 Kawano
9,117,853 B2 8/2015 Tsubaki

FOREIGN PATENT DOCUMENTS

CN 204586829 U 8/2015
CN 205696215 U 11/2016
CN 206456375 U 9/2017
(Continued)

OTHER PUBLICATIONS

First Office Action of the Chinese application No. 202010848948.8, issued on Jun. 6, 2022, 17 pgs.
(Continued)

*Primary Examiner* — Robert J McCarry, Jr.
(74) *Attorney, Agent, or Firm* — Kilpatrick Townsend & Stockton LLP

(57) ABSTRACT

An overhead traveling vehicle and an overhead traveling vehicle fault processing system are provided. The overhead traveling vehicle includes: an overhead traveling vehicle main body; a main walking part, installed on the overhead traveling vehicle main body and configured to drive the overhead traveling vehicle main body to walk on tracks; an auxiliary walking part, installed on the overhead traveling vehicle main body and configured to drive the overhead traveling vehicle main body to walk on the tracks; and a control part, configured to control one of the main walking part and the auxiliary walking part to be on the tracks and to control the other one of the main walking part and the auxiliary walking part to leave the tracks.

17 Claims, 17 Drawing Sheets

(56) References Cited

FOREIGN PATENT DOCUMENTS

| | | | |
|---|---|---|---|
| CN | 206783138 U | * 12/2017 | ............... B66C 9/08 |
| CN | 208022594 | 10/2018 | |
| CN | 208500144 U | 2/2019 | |
| CN | 210272288 U | 4/2020 | |
| CN | 111284459 A | 6/2020 | |
| CN | 211255007 U | 8/2020 | |
| JP | 2008239262 A | 10/2008 | |

OTHER PUBLICATIONS

International Search Report in the international application No. PCT/CN2021/103830, mailed on Sep. 3, 2021, 2 pgs.

* cited by examiner

OVERHEAD TRAVELING VEHICLE AND OVERHEAD TRAVELING VEHICLE FAULT PROCESSING SYSTEM

CROSS-REFERENCE TO RELATED APPLICATIONS

This is a continuation application of International Patent Application No. PCT/CN2021/103830, filed on Jun. 30, 2021, which claims priority to Chinese Patent Application No. 202010848948.8, filed on Aug. 21, 2020 and entitled "Overhead Traveling Vehicle and Overhead Traveling Vehicle Fault Processing System". The disclosures of International Patent Application No. PCT/CN2021/103830 and Chinese Patent Application No. 202010848948.8 are incorporated by reference herein in their entireties.

BACKGROUND

An automatic material conveying system generally has a plurality of overhead traveling vehicles, which are configured to grasp and place objects and drive the objects to move along a track. When an overhead traveling vehicle walking on the track fails and cannot walk independently, the whole automatic material conveying system will not operate normally.

At present, when a walking part of the overhead traveling vehicle fails and needs to be maintained, it not only takes time, but also seriously affects the production efficiency. In addition, in the process of dragging the failed overhead traveling vehicle, the safety needs to be improved.

SUMMARY

The embodiments of the present disclosure relate to the field of automatic material transferring, and in particular relates to an overhead traveling vehicle and an overhead traveling vehicle fault processing system.

According to a first aspect of the present disclosure, there is provided an overhead traveling vehicle. The overhead traveling vehicle may include: an overhead traveling vehicle main body; a main walking part, installed on the overhead traveling vehicle main body and configured to drive the overhead traveling vehicle main body to walk on tracks; an auxiliary walking part, installed on the overhead traveling vehicle main body and configured to drive the overhead traveling vehicle main body to walk on the tracks; and a control part, configured to control one of the main walking part and the auxiliary walking part to be on the tracks and to control the other one of the main walking part and the auxiliary walking part to leave the tracks.

According to a second aspect of the present disclosure, there is provided an overhead traveling vehicle fault processing system. The overhead traveling vehicle fault processing system provided in the embodiment of the present disclosure may include an overhead traveling vehicle provided in the above embodiment, a fault detector and a processor. The overhead traveling vehicle walks on tracks and may at least include a main walking part, an auxiliary walking part and a control part. The fault detector is configured to detect a fault of the main walking part. The processor is configured to send a control signal to the control part responsive to that the fault detector detects a fault, so that the control part controls the auxiliary walking part to be on the tracks and control the main walking part to leave the tracks.

BRIEF DESCRIPTION OF THE DRAWINGS

The one or more embodiments are exemplified by the corresponding figures in the drawings, and the exemplary descriptions do not constitute a limitation to the embodiments. Elements in the drawings having the same reference numerals are denoted by like elements, and unless otherwise stated, the figures in the drawings do not constitute a scale limitation.

DETAILED DESCRIPTION

Figure 1:
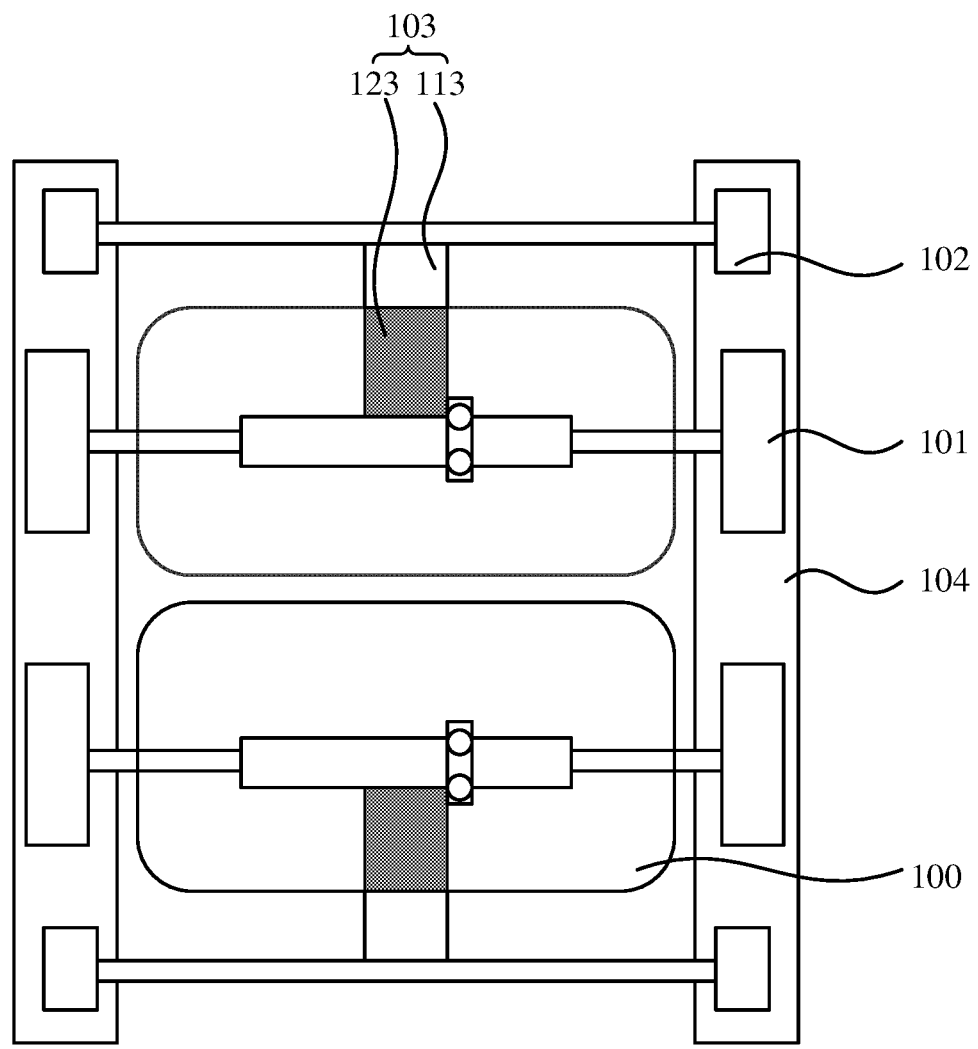
FIG. 1 is a top view of an overhead traveling vehicle according to an embodiment of the present disclosure.

In related art, the fault of an overhead traveling vehicle will seriously affect the production efficiency. It is found by analysis that, the main cause of the above problem may include the risk of damage to a walking part of an overhead traveling vehicle in long-term operation. When a walking motor of the walking part is stuck, it is necessary to manually unlock the walking motor by using a 24 volts (V) driving power supply and then manually trail the vehicle. When the walking motor or an overhead traveling vehicle walking wheel has mechanical failure but the driving power supply may not be used, the vehicle may only be trailed after a fastening screw of the overhead traveling vehicle walking wheel is removed. It takes a long time to remove the fastening screw, which seriously affects the production and transportation, and there is a risk that the walking wheel will fall off during the trailing of the traveling vehicle.

Based on the above problems in the related art, the embodiment of the present disclosure provides an overhead traveling vehicle and an overhead traveling vehicle fault processing system.

According to the embodiment of the present disclosure, by an auxiliary walking part and a control part installed on an overhead traveling vehicle main body, when a fault occurs in a main walking part, the control part controls the auxiliary walking part to walk on tracks and controls the main walking part to leave the tracks. In this way, when a fault occurs in the main walking part, it is unnecessary to use manpower or external machinery to trail the vehicle, thereby shortening the trailing time and reducing the operation risk.

In order to make purposes, technical solutions and advantages of the embodiments of the present disclosure more clear, the various embodiments of the present disclosure are described in detail in combination with the drawings below. However, it can be understood by those of ordinary skill in the art that many technical details are provided in the various embodiments of the present disclosure in order to enable a reader to understand the present disclosure better. However, even if these technical details and a variety of changes and modifications based on the various embodiments below do not exist, the technical solutions claimed by the present disclosure may also be realized.

The embodiment of the present disclosure provides an overhead traveling vehicle. FIG. 1 to FIG. 7 are schematic structural diagrams of the overhead traveling vehicle.

Referring to FIG. 1 to FIG. 7, the overhead traveling vehicle provided in the embodiment of the present disclosure may include: an overhead traveling vehicle main body 100; a main walking part 101, installed on the overhead traveling vehicle main body 100 and configured to drive the overhead traveling vehicle main body 100 to walk on tracks 104; an auxiliary walking part 102, installed on the overhead traveling vehicle main body 100 and configured to drive the overhead traveling vehicle main body 100 to walk on the tracks 104; and a control part 103, configured to control one of the main walking part 101 and the auxiliary walking part 102 to be on the tracks 104 and to control the other one of the main walking part 101 and the auxiliary walking part 102 to leave the tracks 104.

The overhead traveling vehicle provided in the embodiment of the present disclosure will be described in detail in combination with the figures.

FIG. 1 is a top view of an overhead traveling vehicle according to an embodiment of the present disclosure.

Referring to FIG. 1, the overhead traveling vehicle main body 100 is hung on the tracks 104 and configured to convey a wafer box in a semiconductor manufacturing process.

The main walking part 101 is configured to drive the overhead traveling vehicle main body 100 to run on the tracks 104.

The auxiliary walking part 102 is configured to drive the overhead traveling vehicle main body 100 to run on the tracks 104 when a fault occurs in the main walking part 101.

In the embodiment of the present disclosure, the volume of the auxiliary walking part 102 is smaller than that of the main walking part 101. The auxiliary walking part 102 with the smaller volume may save space and reduce the weight of the overhead traveling vehicle. The main walking part 101 with the larger volume has faster running speed and higher conveying efficiency.

The control part 103 may include a first control part 113 configured to control the auxiliary walking part 102 to be on the tracks 104 or to control the auxiliary walking part 102 to leave the tracks 104.

The control part 103 may include a second control part 123 configured to control the main walking part 101 to be on the tracks 104 or to control the main walking part 101 to leave the tracks 104.

Figure 2:
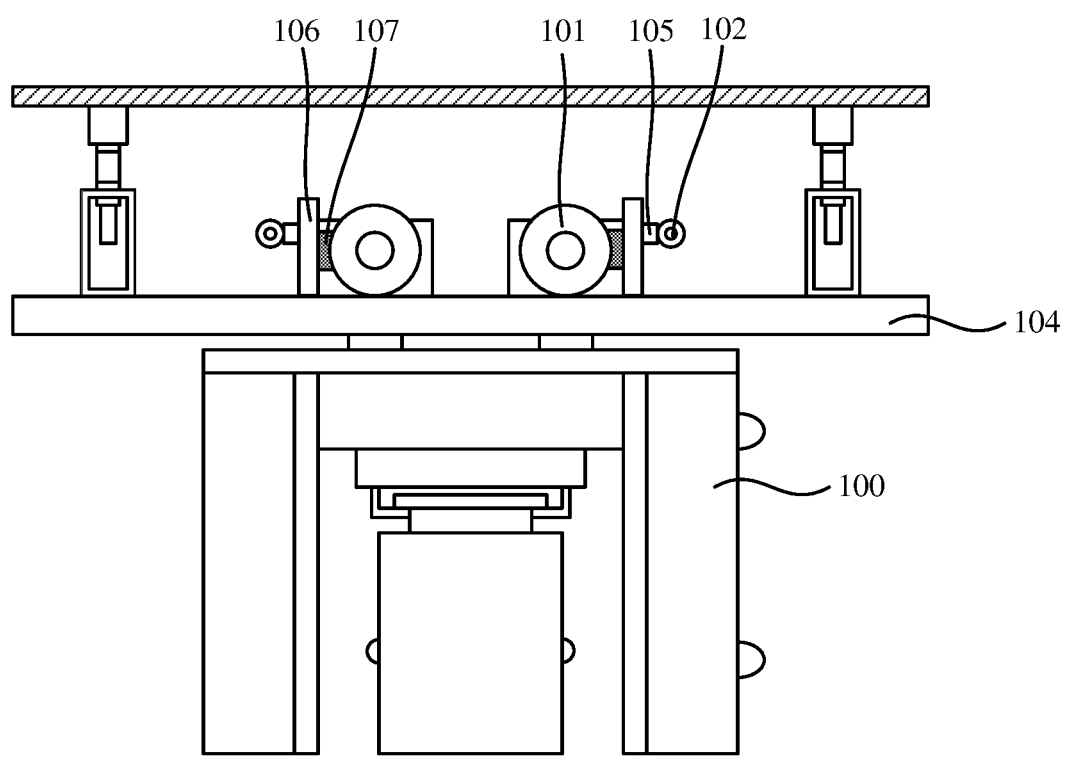
FIG. 2 is a front view of an overhead traveling vehicle when no fault occurs in a main walking part thereof according to an embodiment of the present disclosure.

In some embodiments, referring to FIG. 2, the first control part 113 (referring to FIG. 1) may include first lifting parts 105, which are installed on front and rear sides of the overhead traveling vehicle main body 100 in a walking direction along the tracks 104. The first lifting part 105 is connected with the auxiliary walking part 102. A distance between a joint of the first lifting part 105 with the auxiliary walking part 102 and the tracks 104 is variable, so that the auxiliary walking part 102 is on the tracks 104 or leaves the tracks 104.

In the embodiment of the present disclosure, a fixed support 106 is installed on the overhead traveling vehicle main body 100, and the fixed support 106 is located between two parallel tracks 104. The first lifting part 105 is installed on the fixed support 106. The fixed support 106 may support motion of the first lifting part 105. In other embodiments, the first lifting part may also be directly installed on the overhead traveling vehicle main body.

The first control part 113 may also include a first controller, at least one connecting line and a wireless signal receiver (not shown in the figure). The first controller is connected with the first lifting part 105 and the wireless signal receiver through the connecting line. Responsive to receiving an instruction from a hand-held terminal, the wireless signal receiver sends the instruction to the first controller. Then, the first controller converts the instruction into a control signal and sends the control signal to the first lifting part 105 to control raising or lowering of the first lifting part 105 relative to the tracks 104, so as to control the distance between the auxiliary walking part 102 and the tracks 104, and enable the auxiliary walking part 102 to be on the tracks 104 or leave the tracks 104.

The second control part 123 (referring to FIG. 1) may include a second lifting part 107, installed on the overhead traveling vehicle main body 100 and connected with the main walking part 101. A distance between a joint of the second lifting part 107 with the main walking part 101 and the tracks 104 is variable, so that the main walking part 101 is on the tracks 104 or leaves the tracks 104.

In the embodiment of the present disclosure, the second lifting part 107 is also installed on the fixed support 106. The second lifting part 107 and the first lifting part 105 are respectively located at two sides of the fixed support 106. Both the first lifting part 105 and the second lifting part 107 are installed on the fixed support 106, which may save space and reduce the volume and the weight of the whole overhead traveling vehicle. In other embodiments, the second lifting part may also be installed on another fixed support, or directly installed on the overhead traveling vehicle main body.

The second control part 123 may further include a second controller, at least one connecting line and a wireless signal receiver (not shown in the figure), and the second controller is connected with the second lifting part 107 through the connecting line. The second controller is connected with the second lifting part 107 and the wireless signal receiver through the connecting line. Responsive to receiving an instruction from a hand-held terminal, the wireless signal receiver sends the instruction to the second controller, and the second controller converts the instruction into a control signal and sends the control signal to the second lifting part 107 to control raising and lowering of the second lifting part 107 relative to the tracks 104 so as to control the distance between the main walking part 101 and the tracks 104, and enable the main walking part 101 to be on the tracks 104 or leave the tracks 104.

Figure 3:
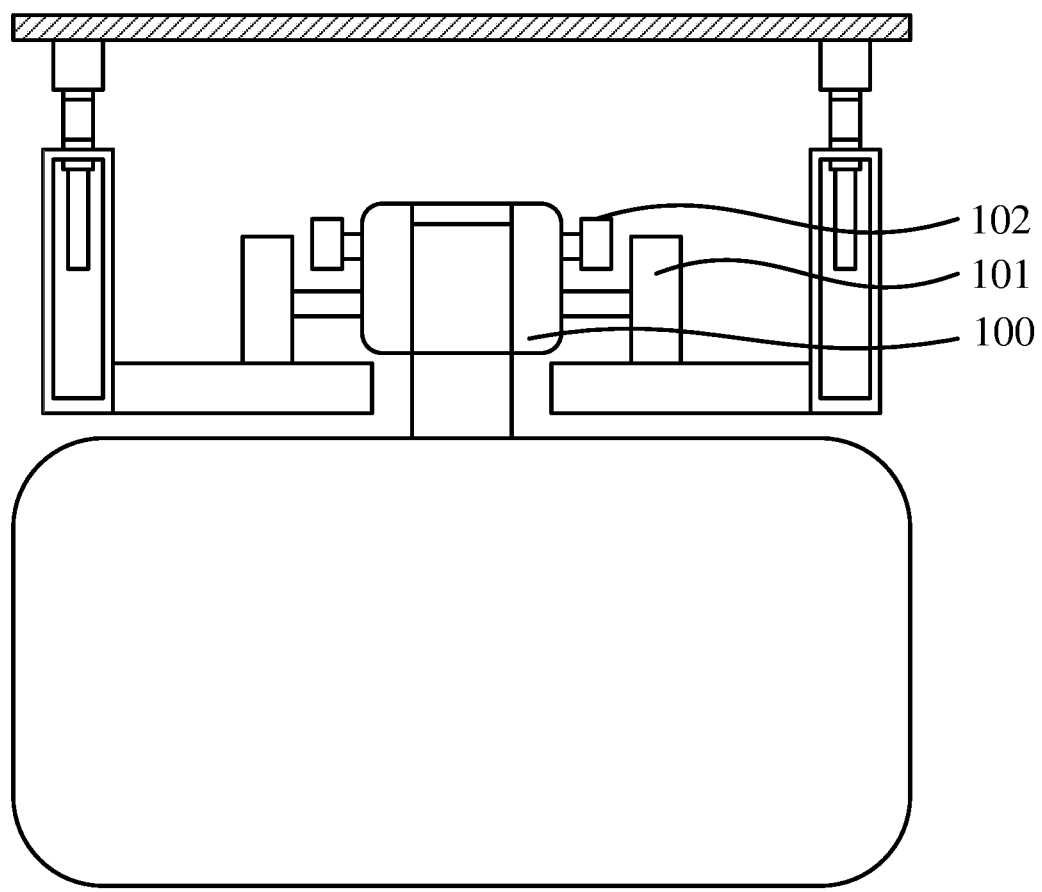
FIG. 3 is a side view of an overhead traveling vehicle when no fault occurs in a main walking part thereof according to an embodiment of the present disclosure.

Referring to FIG. 2 and FIG. 3, in the embodiment of the present disclosure, when no fault occurs in the main walking part 101, the main walking part 101 runs on the tracks 104, and the auxiliary walking part 102 leaves the tracks.

Figure 4:
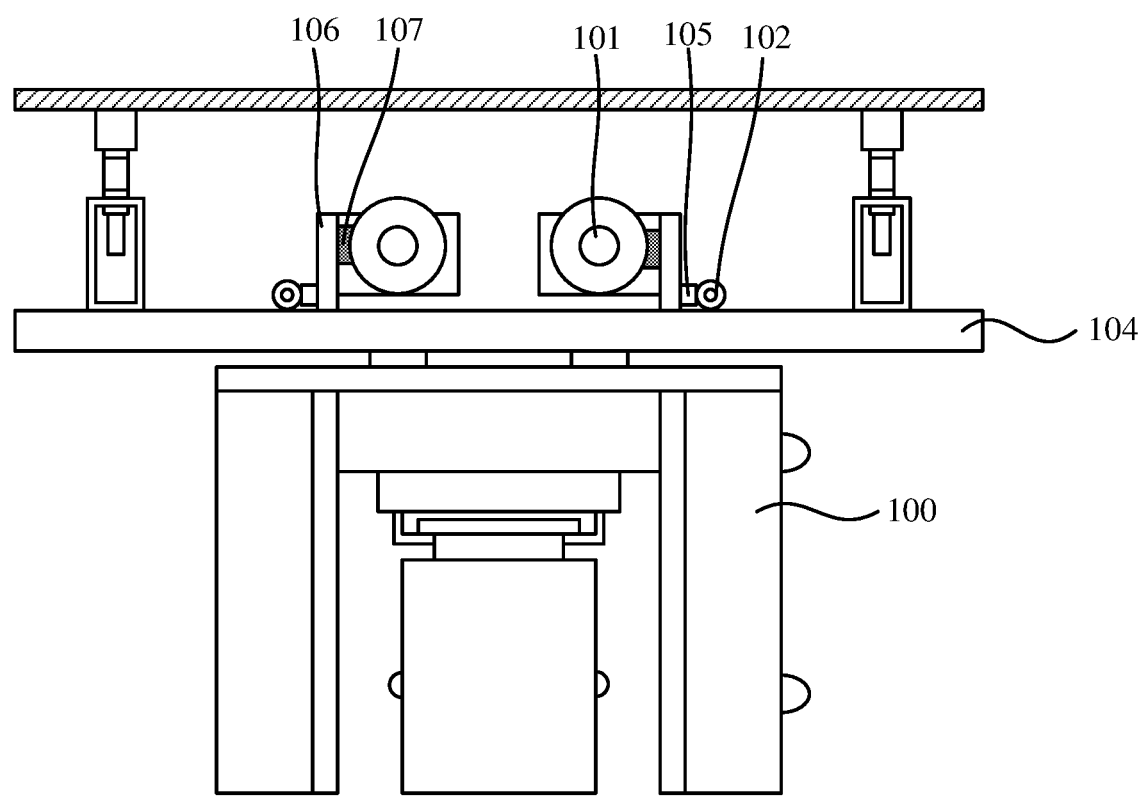
FIG. 4 is a front view of an overhead traveling vehicle when a fault occurs in a main walking part thereof according to an embodiment of the present disclosure.
Figure 5:
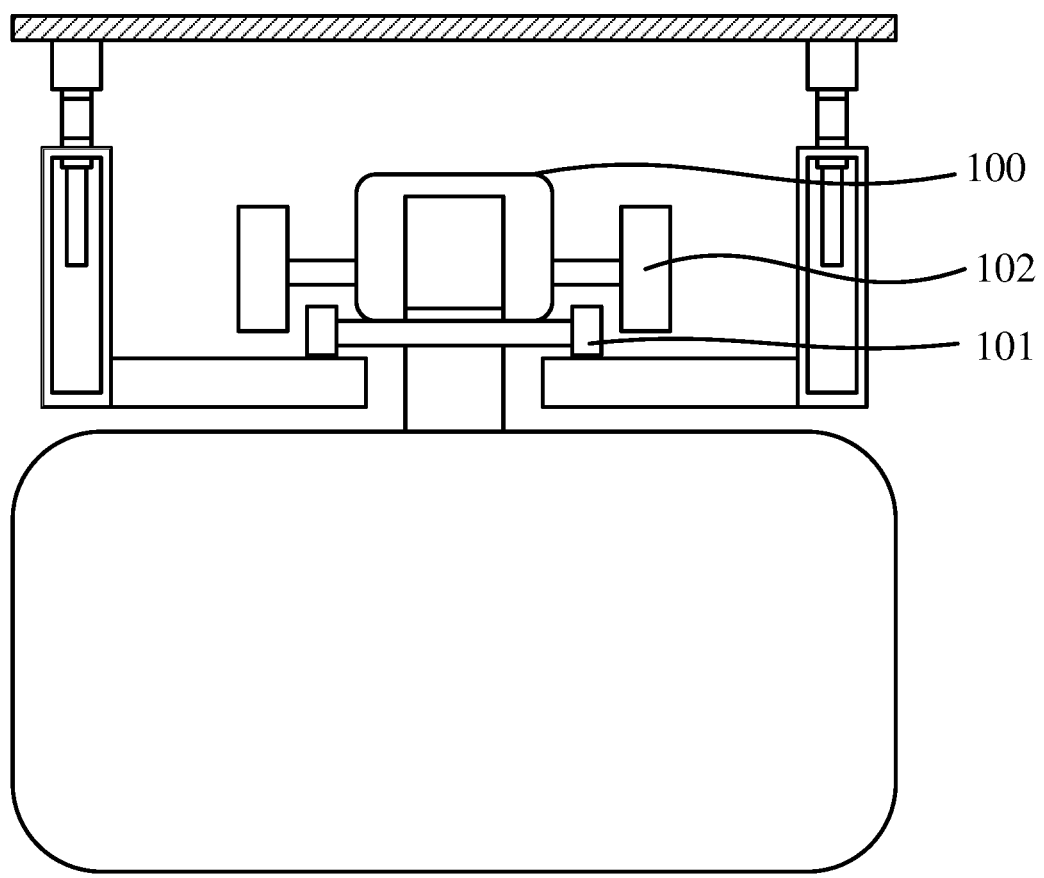
FIG. 5 is a side view of an overhead traveling vehicle when a fault occurs in a main walking part thereof according to an embodiment of the present disclosure.

Referring to FIG. 4 and FIG. 5, when a fault occurs in the main walking part 101, the first controller (not shown in the figure) starts the first lifting part 105 at first, so as to shorten the distance between the auxiliary walking part 102 and the tracks 104. When the auxiliary walking part 102 descends to be on the tracks 104, the second controller (not shown in the figure) starts the second lifting part 107, so as to enable the main walking part 101 to leave the tracks. That is, the process of replacing the main walking part 101 by the auxiliary walking part 102 needs to be realized by the cooperation of the first lifting part 105 and the second lifting part 107.

Figure 6:
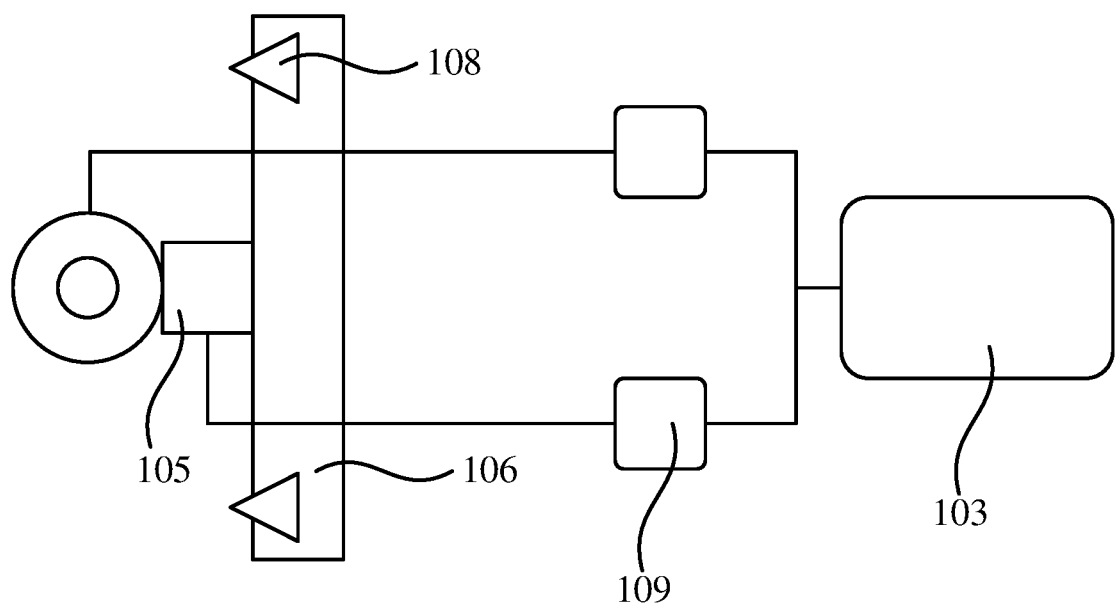
FIG. 6 is a front view of a local structure of an overhead traveling vehicle according to an embodiment of the present disclosure.
Figure 7:
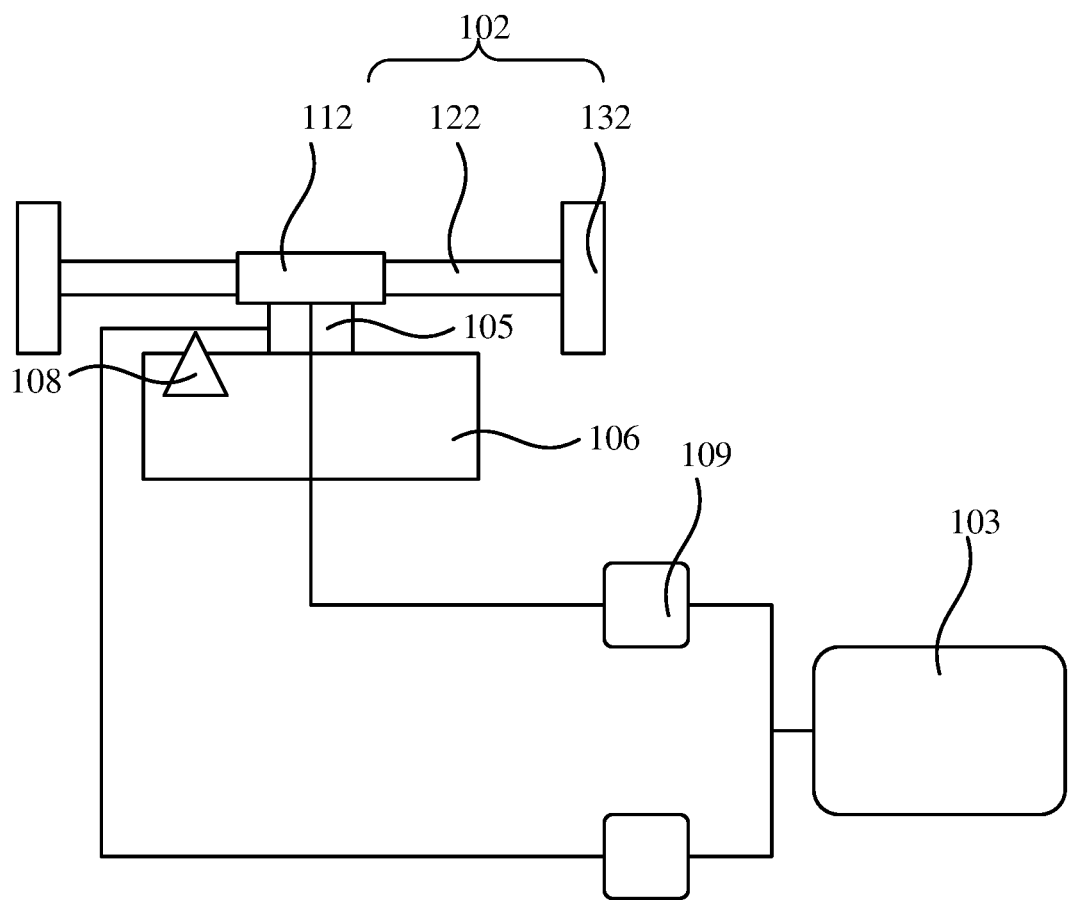
FIG. 7 is a side view of a local structure of an overhead traveling vehicle according to an embodiment of the present disclosure.

Referring to FIG. 6 and FIG. 7, the auxiliary walking part 102 may include a walking motor 112, linkage shafts 122 and auxiliary walking wheels 132. The walking motor 112 rotates to drive the linkage shafts 122 to rotate, and the linkage shafts 122 rotate to drive the auxiliary walking wheels 132 to rotate. In the embodiment of the present disclosure, the walking motor 112 is a double-head motor, each of two heads of the walking motor 112 is connected to an end of a respective linkage shaft 122, and another end of the linkage shaft 122 is connected to an auxiliary walking wheel 132.

In some embodiments, the overhead traveling vehicle may also include a position limiter 108 located on the overhead traveling vehicle main body 100 (referring to FIG. 1 to FIG. 5) and configured to limit a lifting position of the first lifting part 105. In the embodiment of the present disclosure, the position limiter 108 is located on the fixed support 106 on the overhead traveling vehicle main body 100. In other embodiments, the position limiter may also be directly located on the overhead traveling vehicle main body. The position limiter 108 may ensure that the first lifting part 105 descends to a predetermined position.

In some embodiments, the overhead traveling vehicle may further include a plurality of power devices 109, which are respectively connected with the first lifting part 105 and the walking motor 112, and are configured to supply power to the first lifting part 105 and the walking motor 112. The plurality of power devices 109 are also connected with the control part 103, and are controlled by the control part 103.

According to the embodiment of the present disclosure, the first lifting part is controlled by the first controller, so that the auxiliary walking part descends to be on the tracks, and the second lifting part is controlled by the second controller, so that the main walking part leaves the tracks. As such, the main walking part is replaced by the auxiliary walking part. The embodiment of the present disclosure is unnecessary to use manpower or external machinery to trail a faulty overhead traveling vehicle, and the auxiliary walking part drives the overhead traveling vehicle main body to move faster and safer.

An embodiment of the present disclosure provides an overhead traveling vehicle. FIG. 8 to FIG. 13 are schematic structural diagrams of the overhead traveling vehicle.

The overhead traveling vehicle provided in the embodiment of the present disclosure may include an overhead traveling vehicle main body 200, a main walking part 201, an auxiliary walking part 202 and a control part 103 (referring to FIG. 1). The overhead traveling vehicle provided in the embodiment of the present disclosure is generally consistent with the overhead traveling vehicle provided in the above embodiment, and the main differences are as follows. In the embodiment of the present disclosure, there is no second control part, and only by means of the first control part 113 (referring to FIG. 1), the auxiliary walking part 202 may be controlled to be on tracks 204 and the main walking part 201 may be controlled to leave the tracks 204, or the auxiliary walking part 202 is controlled to leave the tracks 204 and the main walking part 201 is controlled to be on the tracks 204. The first control part 113 in the embodiment of the present disclosure may include a first controller, at least one connecting line, a wireless signal receiver and a first lifting part 205, and the first controller receives an instruction from the wireless signal receiver, and controls lifting and lowering of the first lifting part 205. The embodiment of the present disclosure and the above embodiment have same structures, please referring to the above embodiment for understanding, which will not be elaborated herein.

The structure of the overhead traveling vehicle will be described in detail in combination with the drawings.

Figure 8:
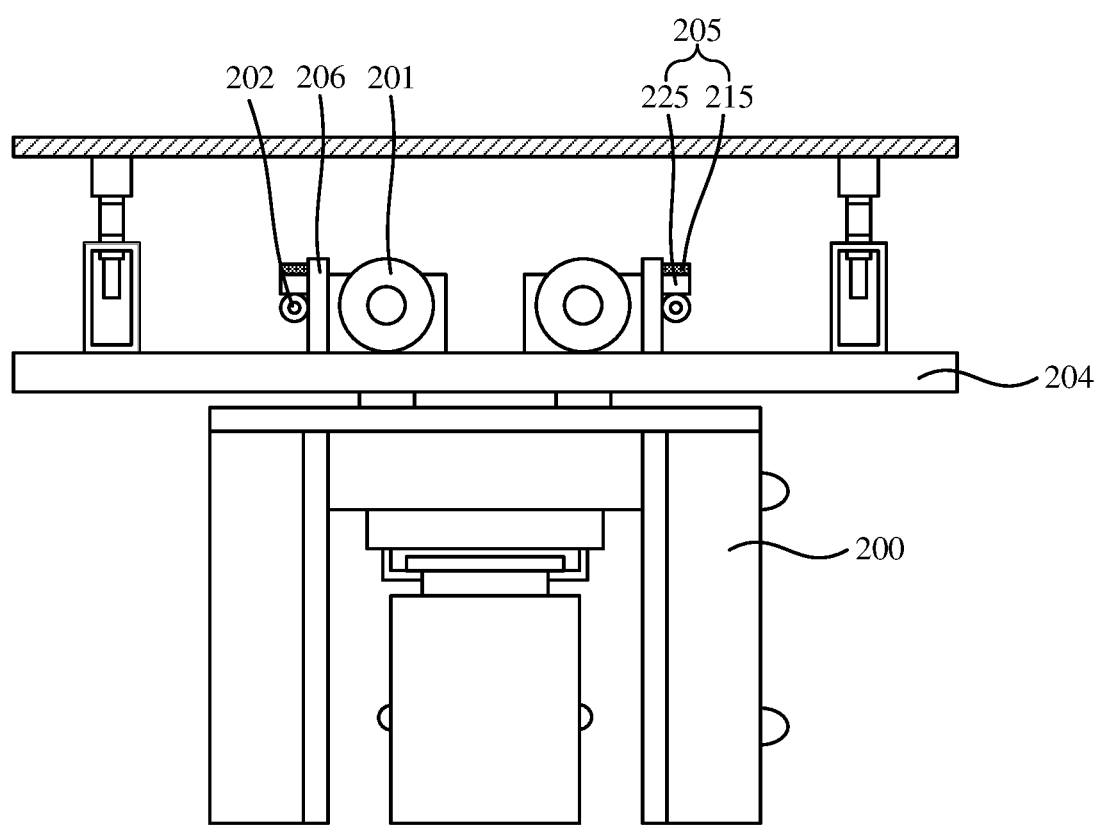
FIG. 8 is the first front view of an overhead traveling vehicle when no fault occurs in a main walking part thereof according to an embodiment of the present disclosure.
Figure 9:
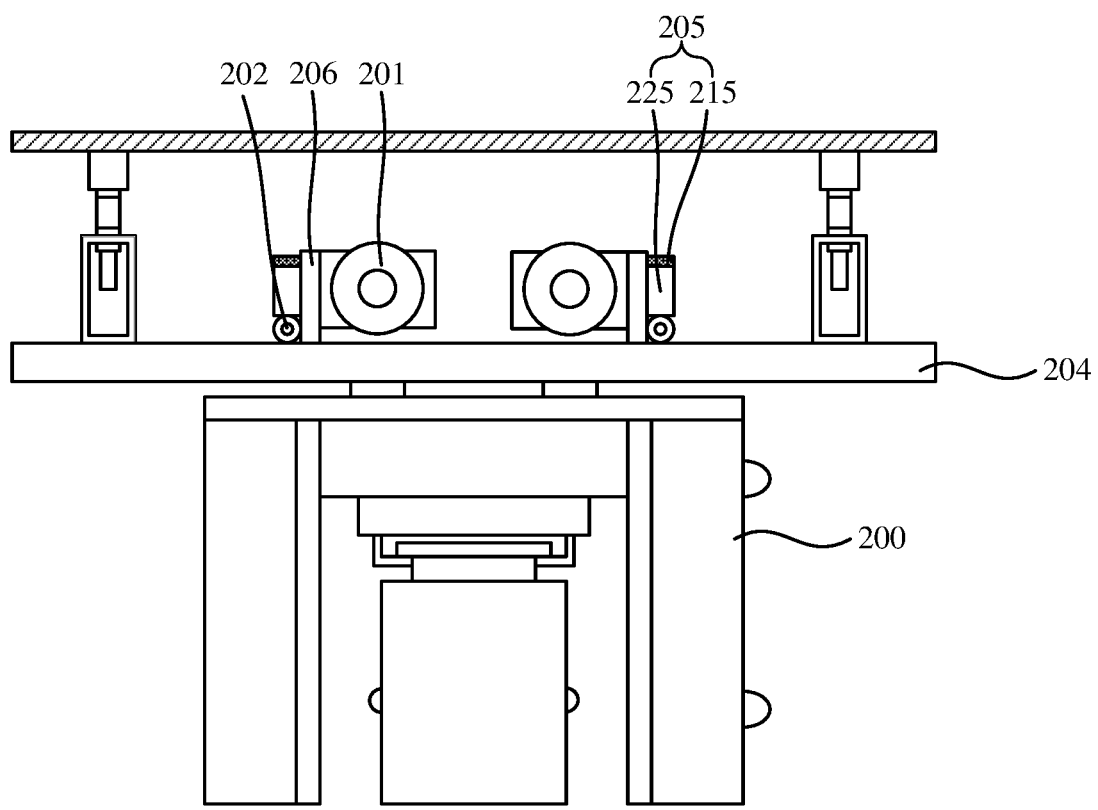
FIG. 9 is the first front view of an overhead traveling vehicle when a fault occurs in a main walking part thereof according to an embodiment of the present disclosure.

Referring to FIG. 8 and FIG. 9, the first lifting part 205 may include a first lifting driver 215 and a first adjusting part 225. The first lifting driver 215 is connected with the first adjusting part 225, and the first adjusting part 225 is connected with the auxiliary walking part 202. The first lifting driver 215 adjusts a position or a shape of the first adjusting part 225, so as to enable the auxiliary walking part 202 to be on the tracks 204 and enable the main walking part 201 to leave the tracks 204, or enable the auxiliary walking part 202 to leave the tracks 204 and enable the main walking part 201 to be on the tracks 204.

Continuously referring to FIG. 8 and FIG. 9, the first adjusting part 225 is a first telescopic part, the first lifting driver 215 drives the first telescopic part to elongate or shorten. The first telescopic part is elongated, so that the distance between the joint and the tracks 204 is reduced, and the first telescopic part is shortened, so that the distance between the joint and the tracks 204 is increased.

In some embodiments, when a fault occurs in the main walking part 201, the first telescopic part is elongated, so that the distance between the auxiliary walking part 202 and the tracks 204 is reduced. After the auxiliary walking part 202 descends to be on the tracks 204, the first telescopic part is continuously elongated, at this time, the auxiliary walking part applies counter-acting force on the first telescopic part and the overhead traveling vehicle main body 200 under supporting of the tracks 204, so that the overhead traveling vehicle main body 200 ascends relative to the tracks 204, and finally, the main walking part 201 leaves the tracks 204.

The first telescopic part may include an air cylinder or a hydraulic oil cylinder. The first lifting driver 215 may include a motor or an electromagnetic valve.

Figure 10:
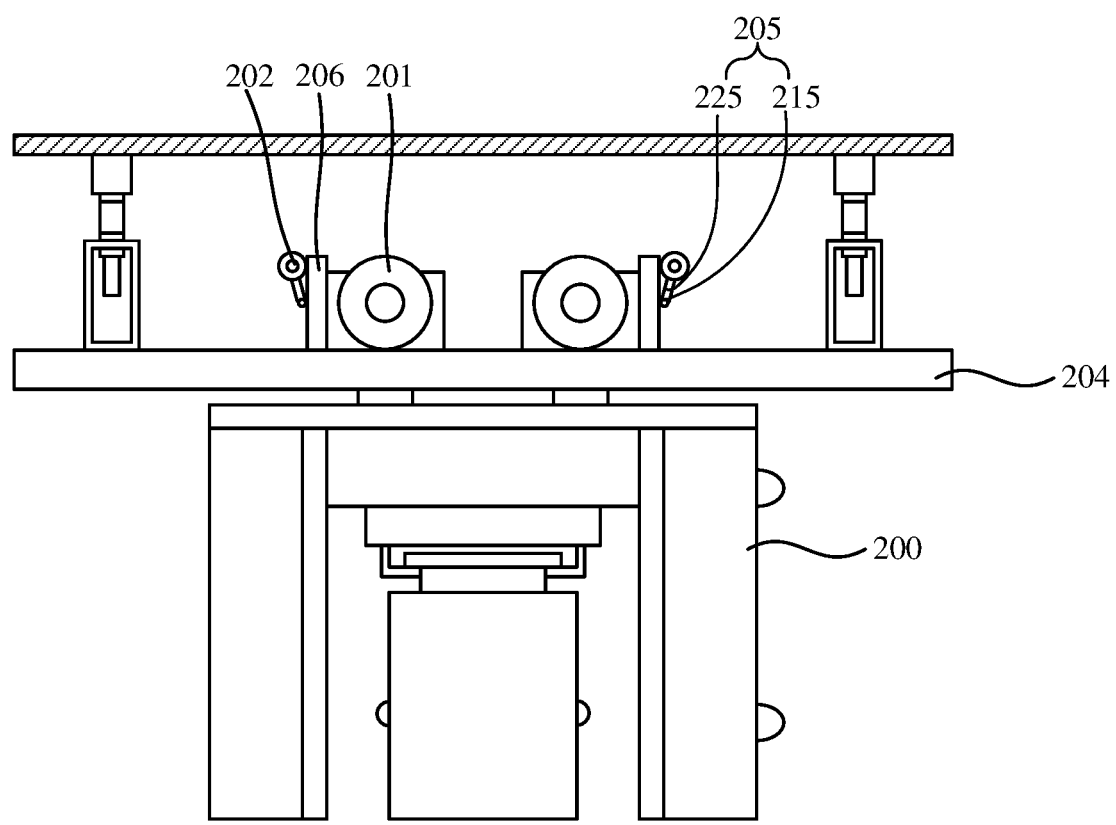
FIG. 10 is the second front view of an overhead traveling vehicle when no fault occurs in a main walking part thereof according to an embodiment of the present disclosure.
Figure 11:
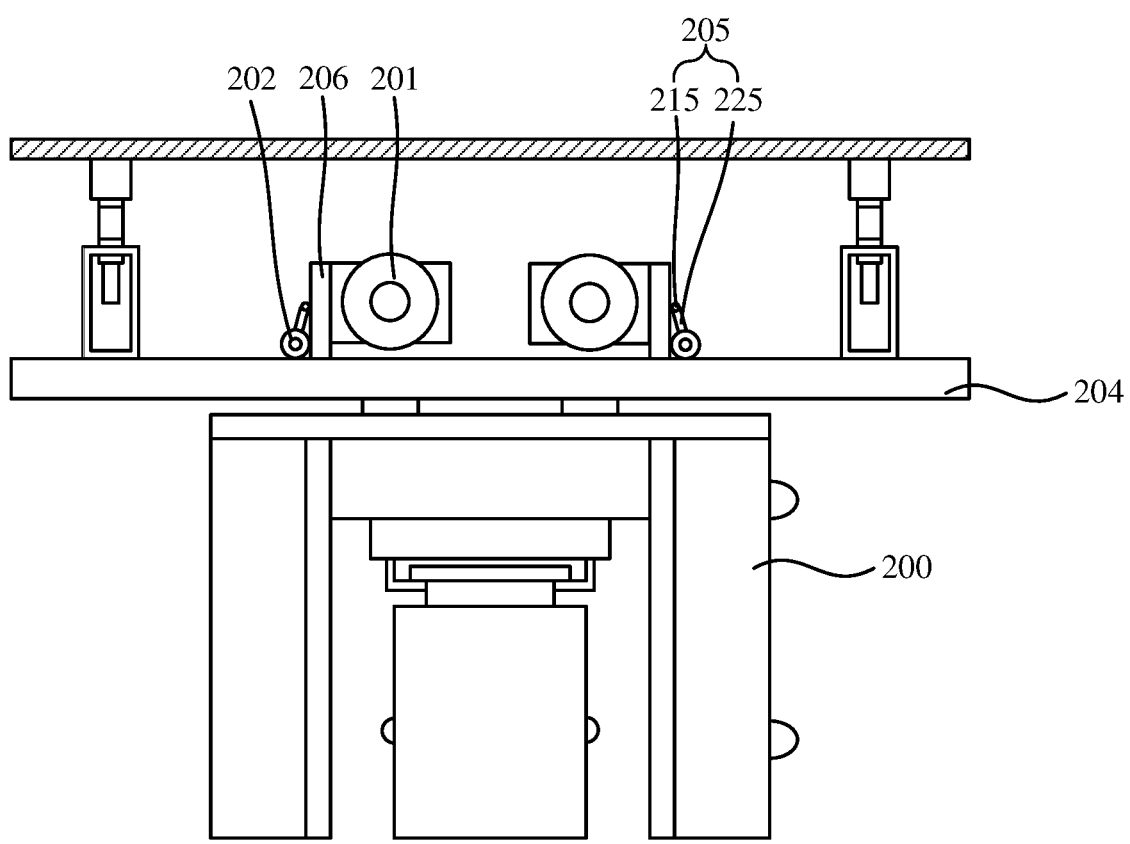
FIG. 11 is the second front view of an overhead traveling vehicle when a fault occurs in a main walking part thereof according to an embodiment of the present disclosure.

Referring to FIG. 10 and FIG. 11, the first adjusting part 225 is a first rotating part, one end of the first rotating part is fixed relative to the overhead traveling vehicle main body 200, and the first lifting driver 215 drives an end of the first rotating part connected with the auxiliary walking part 202 to rotate, so that the distance between the joint and the tracks 204 is changed.

In some embodiments, after a fault occurs in the main walking part 201, an end of the first rotating part connected with the auxiliary walking part 202 rotates towards the tracks 204, and the distance between the auxiliary walking part 202 and the tracks 204 is reduced. After the auxiliary walking part 202 descends to be on the tracks 204, the first rotating part continuously rotates, at this time, the auxiliary walking part 202 applies counter-acting force on the first rotating part and the overhead traveling vehicle main body 200 under supporting of the tracks 204, so that the overhead traveling vehicle main body 200 ascends relative to the tracks 204, and finally the main walking part 201 leaves the tracks 204.

Figure 12:
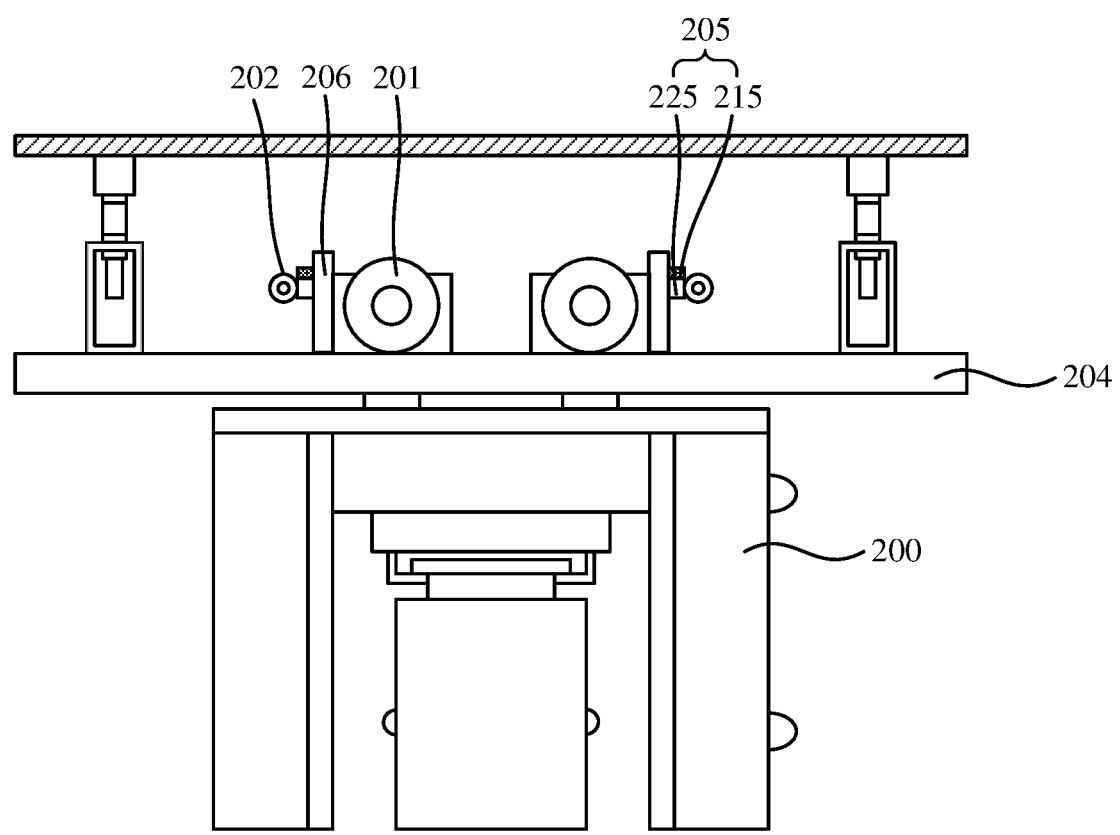
FIG. 12 is the third front view of an overhead traveling vehicle when no fault occurs in a main walking part thereof according to an embodiment of the present disclosure.
Figure 13:
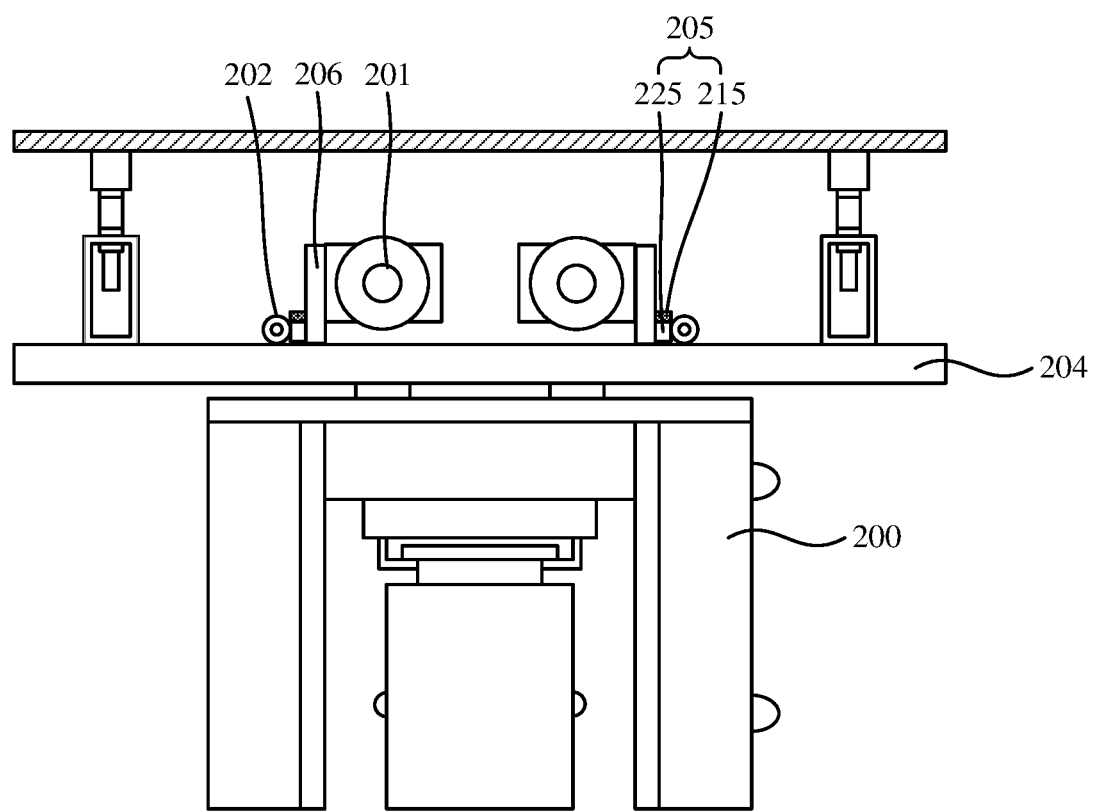
FIG. 13 is the third front view of an overhead traveling vehicle when a fault occurs in a main walking part thereof according to an embodiment of the present disclosure.

Referring to FIG. 12 and FIG. 13, the first adjusting part 225 may include a sliding rail and a sliding block which are arranged on the overhead traveling vehicle main body (not shown in the figure). The sliding block is connected with the auxiliary walking part 202, and the first lifting driver 215 drives the sliding block, so that the sliding block moves on the sliding rail along a direction towards the tracks 204 or a direction away from the tracks 204.

In some embodiments, after a fault occurs in the main walking part 201, the sliding block slides towards the tracks 204 along the sliding rail, and the distance between the auxiliary walking part 202 and the tracks 204 is reduced. After the auxiliary walking part 202 descends to be on the tracks 204, the sliding block continuously slides downward along the sliding rail, at this time, the auxiliary walking part 202 applies counter-acting force on the sliding rail and the overhead traveling vehicle main body 200 under supporting of the tracks 204, so that the overhead traveling vehicle main body 200 ascends relative to the tracks 204, and finally the main walking part 201 leaves the tracks 204.

According to the embodiment of the present disclosure, after a fault occurs in the main walking part, the first controller starts the first lifting driver, and the first lifting driver adjusts a shape or a position of the first adjusting part, so that the auxiliary walking part descends to be on the tracks. After the auxiliary walking part descends to be on the tracks, the shape or the position of the first adjusting part is continuously changed, so that the auxiliary walking part applies counter-acting force on the first lifting part and the overhead traveling vehicle main body under supporting of the tracks, and finally the overhead traveling vehicle main body ascends, and the main walking part leaves the tracks. Therefore, after a fault occurs in the main walking part, it is unnecessary to use manpower or external machinery to trail the vehicle, thereby shortening the trailing time and reducing the operation risk.

Figure 14:
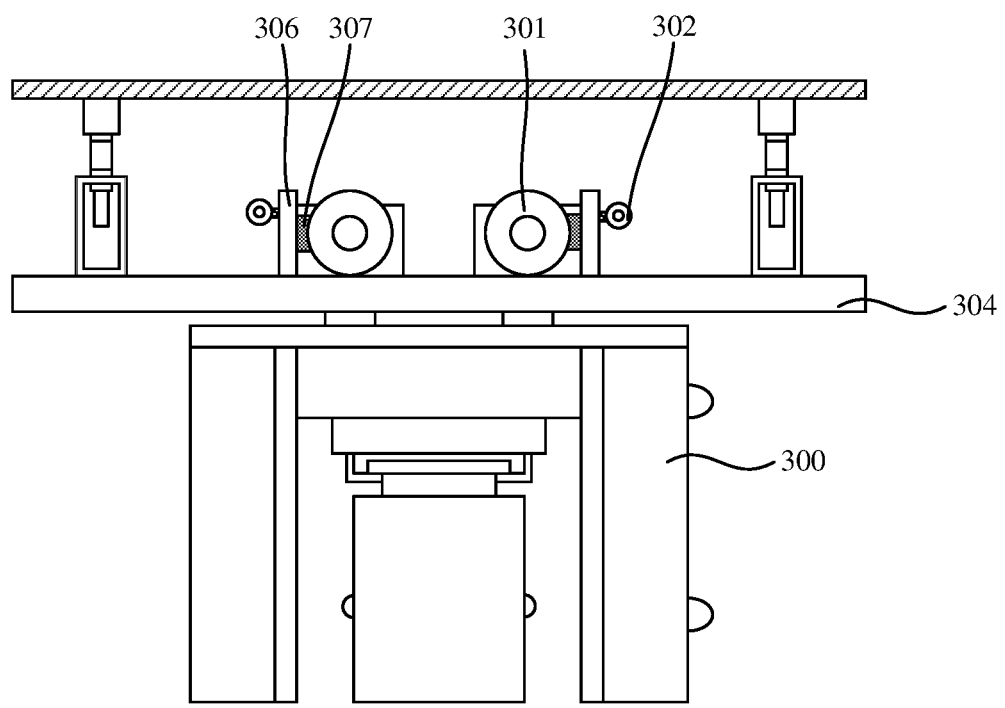
FIG. 14 is a front view of an overhead traveling vehicle when no fault occurs in a main walking part thereof according to an embodiment of the present disclosure.
Figure 15:
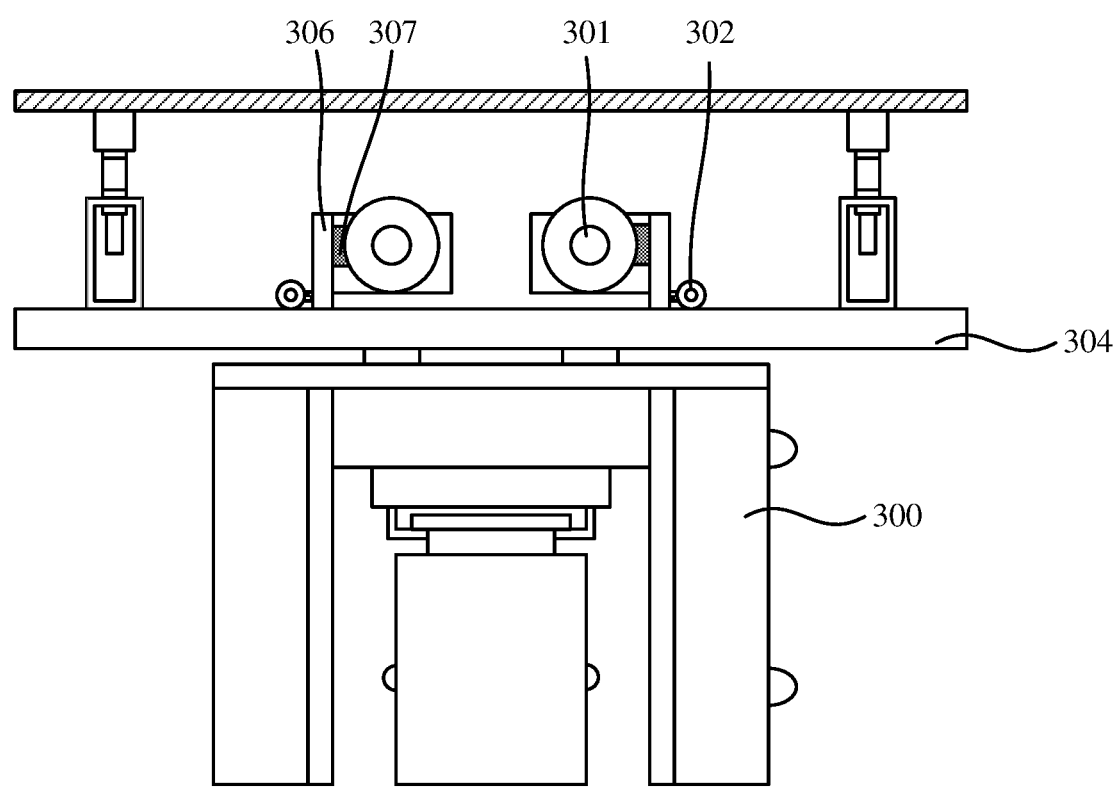
FIG. 15 is a front view of an overhead traveling vehicle when a fault occurs in a main walking part thereof according to an embodiment of the present disclosure.

An embodiment of the present disclosure provides an overhead traveling vehicle. FIG. 14 to FIG. 15 are schematic structural diagrams of the overhead traveling vehicle.

Referring to FIG. 14 and FIG. 15, the overhead traveling vehicle provided in the embodiment of the present disclosure may include an overhead traveling vehicle main body 300, a main walking part 301, an auxiliary walking part 302 and a control part 103 (referring to FIG. 1). The overhead traveling vehicle provided in the embodiment of the present disclosure is generally consistent with the overhead traveling vehicle provided in the above embodiment, and the main differences are as follows. In the embodiment of the present disclosure, there is no first control part, only by means of the second control part 123 (referring to FIG. 1), the auxiliary walking part 302 may be controlled to be on tracks 304 and the main walking part 301 may be controlled to leave the tracks 304, or the auxiliary walking part 302 is controlled to leave the tracks 304 and the main walking part 301 is controlled to be on the tracks 304. The second control part 123 in the embodiment of the present disclosure may include a second controller, at least one connecting line, a wireless signal receiver and a second lifting part 307. The second controller receives an instruction from the wireless signal receiver, and controls the lifting and lowering of the second lifting part 307. Other structures may be understood with reference to the above embodiment, which will not be elaborated herein.

Referring to FIG. 14, when no fault occurs in the main walking part 301, the main walking part 301 runs on the tracks 304, and the auxiliary walking part 302 leaves the tracks 304.

Referring to FIG. 15, when a fault occurs in the main walking part 301, the second controller (not shown in the figure) starts the second lifting part 307, and the movement of the main walking part 301 and the auxiliary walking part 302 is divided into three stages. In a first stage, the second lifting part 307 applies upward ascending force on the main walking part 301, at this time, the distance between the auxiliary walking part 302 and the tracks 304 is reduced, but the main walking part 301 still does not leave the tracks 304. In a second stage, the auxiliary walking part 302 descends to be on the tracks 304, and the main walking part 301 does not leave the tracks 304. In a third stage, the second lifting part 307 continuously applies upward ascending force on the main walking part 301, the main walking part 301 then ascends relative to the tracks 304, and finally, the main walking part 301 leaves the tracks.

The second lifting part 307 may include a second lifting driver and a second adjusting part (not shown in the figure), the second lifting driver is connected with the second adjusting part, and the second adjusting part is connected with the main walking part. The second lifting driver adjusts a position or a shape of the second adjusting part, so as to enable the main walking part 301 to be on the tracks and enable the auxiliary walking part 302 to leave the tracks 304, or enable the main walking part 301 to leave the tracks 304 and enable the auxiliary walking part 302 to be on the tracks 304.

The second adjusting part may include a second telescopic part, a second rotating part and an assembly of sliding block and sliding rail, which may be referred to the detailed description of the above first adjusting part and will not be elaborated herein.

According to the embodiment of the present disclosure, the second lifting part is controlled by the second controller, so that the auxiliary walking part descends to be on the tracks and the main walking part leaves the tracks, and thus the auxiliary walking part may drive the overhead traveling vehicle main body to run on the tracks faster and safer, without needing manpower or external machinery to trail the vehicle.

The embodiment of the present disclosure provides an overhead traveling vehicle, which is a different combination of the above three embodiments The overhead traveling vehicle may include an overhead traveling vehicle main body, a main walking part, an auxiliary walking part and a control part. The control part may include a first control part and a second control part. The embodiment of the present disclosure and the above embodiments have a same structure, please refer to detailed description of the above embodiments, which will not be elaborated herein.

The first control part may include a first lifting part, and the first lifting part may include a first lifting driver and a first adjusting part. The first adjusting part may be a first telescopic part, a first rotating part or an assembly of sliding rail and sliding block. Detailed description of the first lifting part refers to the above embodiments.

The second control part may include a second lifting part, and the second lifting part may include a second lifting driver and a second adjusting part. The second adjusting part may be a second telescopic part, a second rotating part or an assembly of sliding rail and sliding block. Detailed description of the second lifting part refers to the above embodiments.

According to the embodiment of the present disclosure, by cooperation of the first lifting part and the second lifting part, ascending of the faulty main walking wheels and descending of the auxiliary walking part may be achieved. Therefore, the auxiliary walking part may drive the overhead traveling vehicle main body to run to a maintenance point quickly, which is unnecessary to use manpower or external machinery to trail the vehicle, and thus the efficiency and the safety are higher.

Figure 16:
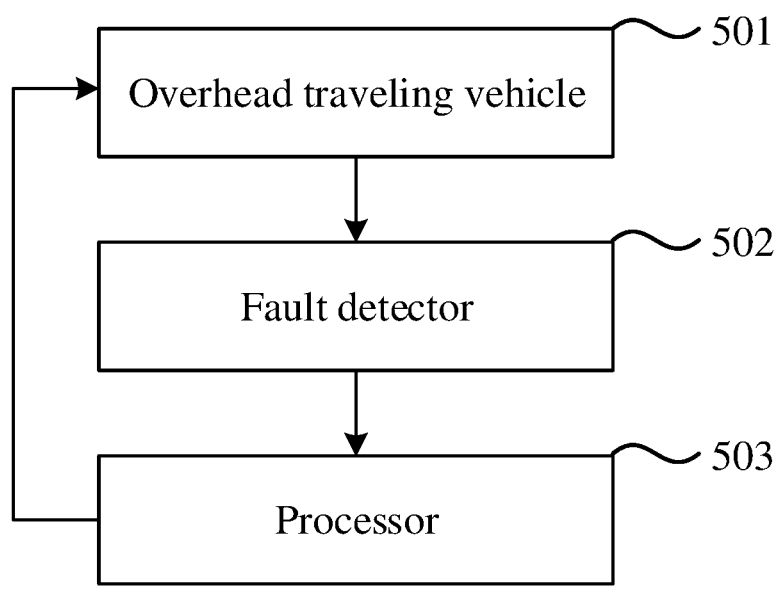
FIG. 16 is a functional schematic structural diagram of an overhead traveling vehicle fault processing system according to an embodiment of the present disclosure.

An embodiment of the present disclosure provides an overhead traveling vehicle fault processing system. FIG. 16 is a functional schematic structural diagram of an overhead traveling vehicle fault processing system.

In the embodiment of the present disclosure, the fault processing system may include an overhead traveling vehicle 501, a fault detector 502 and a processor 503. The overhead traveling vehicle 501 is described in the above embodiment. The overhead traveling vehicle 501 runs on tracks and may at least include a main walking part, an auxiliary walking part and a control part. The fault detector 502 is configured to detect a fault of the main walking part of the overhead traveling vehicle 501. The processor 503 is configured to send a control signal to a control part 103 (referring to FIG. 1) responsive to that the fault detector 502 detects a fault, so that the control part 103 controls the auxiliary walking part 102 to be on tracks 104 and control the main walking part 101 to leave the tracks 104 (referring to FIG. 1).

Besides, an embodiment of the present disclosure further provides a fault processing method, which may include the following operations. The above overhead traveling vehicle is provided, the overhead traveling vehicle walking on tracks and at least including a main walking part, an auxiliary walking part and a control part. The auxiliary walking part is controlled to descend and an overhead traveling vehicle main body is controlled to ascend when a fault occurs in the main walking part of the overhead traveling vehicle, so that the main walking part leaves the tracks. The auxiliary walking part is controlled to walk after the main walking part leaves the tracks, so that the auxiliary walking part drives the overheard traveling vehicle main body to walk to a maintenance point. The auxiliary walking part is controlled to ascend and the main walking part is controlled to descend after the maintenance point is reached. The following will be described in detail in combination with the figure.

Figure 17:
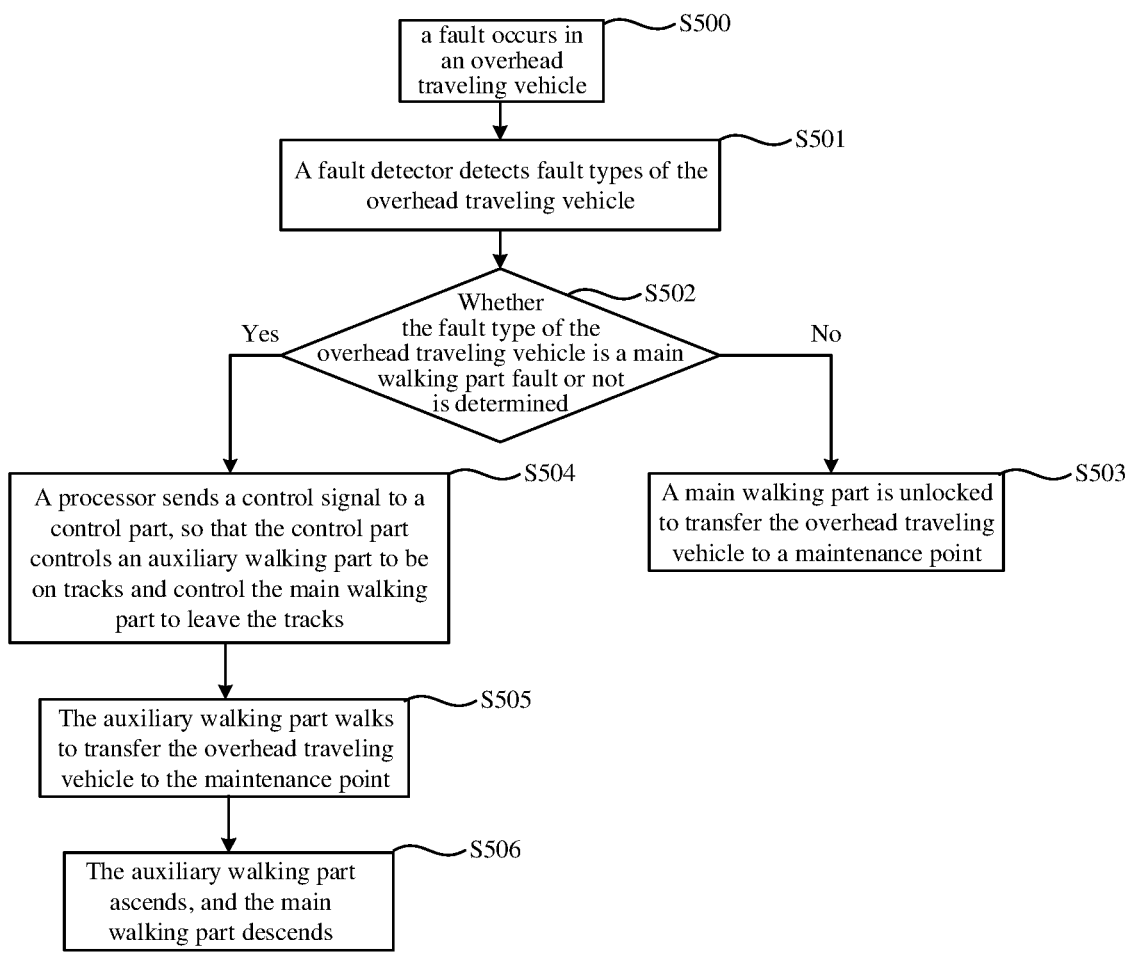
FIG. 17 is a schematic flowchart of an overhead traveling vehicle fault processing method according to an embodiment of the present disclosure.

As shown in FIG. 17, at S500, a fault occurs in the overhead traveling vehicle.

The overhead traveling vehicle walks on the tracks. Faults of the overhead traveling vehicle include a driving fault, a sensor fault, a main walking part fault and the like. After a fault occurs in the overhead traveling vehicle, the main walking part of the overhead traveling vehicle stops walking.

At S501, the fault detector detects fault types of the overhead traveling vehicle.

The fault types include a main walking part fault and a non-main walking part fault. If the main walking part fault occurs, the auxiliary walking part needs to be started, and the auxiliary walking part replaces the main walking part to transfer the overhead traveling vehicle to the maintenance point. If the non-main walking part fault occurs, the auxiliary walking part does not need to be started, the main walking part is directly unlocked to transfer the overhead traveling vehicle to the maintenance point.

At S502, whether the fault type of the overhead traveling vehicle is the main walking part fault or not is determined.

When the fault is the non-main walking part fault, S503 is executed. When the fault is the main walking part fault, S504 is executed.

At S503, the main walking part is unlocked to transfer the overhead traveling vehicle to the maintenance point.

When the fault is the non-main walking part fault, a worker resets the state of the overhead traveling vehicle by using a hand-held remote controller terminal, and after the state is reset successfully, the main walking part is automatically unlocked to transfer the overhead traveling vehicle to the maintenance point.

At S504, the processor sends a control signal to the control part, so that the control part controls the auxiliary walking part to be on the tracks and control the main walking part to leave the tracks.

The processor may include a hand-held remote controller terminal. The worker sends an instruction to the wireless signal receiver by using the hand-held remote controller terminal, the wireless signal receiver sends the instruction to the first controller or the second controller, the first controller converts the instruction into a control signal and sends the control signal to the first lifting part, the second controller converts the instruction into a control signal and sends the control signal to the second lifting part, so that the auxiliary walking wheels descends to be on the tracks, the overhead traveling vehicle main body ascends, and the main walking part leaves the tracks.

At S505, the auxiliary walking part walks, to transfer the overhead traveling vehicle to the maintenance point.

The worker sends an instruction to the control part by using the hand-held remote controller terminal so as to control the walking motor to rotate, and the rotation of the walking motor drives the linkage shafts to rotate, thereby driving the auxiliary walking part to rotate so as to transfer the overhead traveling vehicle to the maintenance point.

At S506, the auxiliary walking part ascends, and the main walking part descends.

The worker sends an instruction to the control part by using the hand-held remote controller terminal so as to control the first lifting driver or the second lifting driver, so that the auxiliary walking part ascends, and the main walking part descends.

According to the fault processing system and the fault processing method provided in the embodiment of the present disclosure, the auxiliary walking part may be started rapidly, and transferring of a faulty overhead traveling vehicle can be completed without needing to use manpower or external machinery to trail the vehicle and with higher efficiency and safety.

It can be understood by those of ordinary skill in the art that, the above various implementation modes are some embodiments for realizing the present disclosure. In practical application, various changes on the embodiments can be made in form and detail, without departing from the spirit and the scope of the present disclosure. Any skilled in the art may implement respective variations and modifications without departing from the spirit and scope of the embodiment of the present disclosure, and thus the scope of protection of the embodiment of the present disclosure should be subject to the scope defined by the claims.

The invention claimed is:

1. An overhead traveling vehicle, comprising:
an overhead traveling vehicle main body;
a main walking part, installed on the overhead traveling vehicle main body and configured to drive the overhead traveling vehicle main body to walk on tracks;
an auxiliary walking part, installed on the overhead traveling vehicle main body and configured to drive the overhead traveling vehicle main body to walk on the tracks;
a control part, configured to control one of the main walking part and the auxiliary walking part to be on the tracks and to control the other one of the main walking part and the auxiliary walking part to leave the tracks;
the control part comprises a first control part, wherein the first control part comprises first lifting parts, which are installed on front and rear sides of the overhead traveling vehicle main body in a walking direction along the tracks, the first lifting part is connected with the auxiliary walking part, and a distance of a joint of the first lifting part with the auxiliary walking part and the tracks is variable, so that the auxiliary walking part is on the tracks or leaves the tracks; and
a position limiter, wherein the position limiter is located on the overhead traveling vehicle main body and configured to limit a lifting position of the first lifting part.

2. The overhead traveling vehicle according to claim 1, wherein the first lifting part comprises a first lifting driver and a first adjusting part, the first lifting driver is connected with the first adjusting part, and the first adjusting part is connected with the auxiliary walking part, and wherein the first lifting driver adjusts a position or a shape of the first adjusting part, so as to enable the auxiliary walking part to be on the tracks and enable the main walking part to leave the tracks, or enable the auxiliary walking part to leave the tracks and enable the main walking part to be on the tracks.

3. The overhead traveling vehicle according to claim 2, wherein the first adjusting part is a first telescopic part, the first lifting driver drives the first telescopic part to elongate or shorten, and wherein the first telescopic part is elongated, so that the distance between the joint and the tracks is reduced, and the first telescopic part is shortened, so that the distance between the joint and the tracks is increased.

4. The overhead traveling vehicle according to claim 2, wherein the first adjusting part is a first rotating part, which has an end fixed relative to the overhead traveling vehicle main body, and the first lifting driver drives an end of the first rotating part connected with the auxiliary walking part to rotate, so that the distance between the joint and the tracks is changed.

5. The overhead traveling vehicle according to claim 2, wherein the first adjusting part comprises a sliding rail and a sliding block which are arranged on the overhead traveling vehicle main body, the sliding block is connected with the auxiliary walking part, and the first lifting driver drives the sliding block, so that the sliding block moves on the sliding rail along a direction towards the tracks or a direction away from the tracks.

6. The overhead traveling vehicle according to claim 1, wherein the control part comprises a second control part configured to control the main walking part to be on the tracks or to control the main walking part to leave the tracks.

7. The overhead traveling vehicle according to claim 6, wherein the second control part comprises a second lifting part installed on the overhead traveling vehicle main body and connected with the main walking part, and wherein a distance between a joint of the second lifting part with the main walking part and the tracks is variable, so that the main walking part is on the tracks or leaves the tracks.

8. The overhead traveling vehicle according to claim 7, wherein the second lifting part comprises a second lifting driver and a second adjusting part, the second lifting driver is connected with the second adjusting part, and the second adjusting part is connected with the main walking part, and wherein the second lifting driver adjusts a position or a shape of the second adjusting part, so as to enable the main walking part to be on the tracks and enable the auxiliary walking part to leave the tracks, or enable the main walking part to leave the tracks and enable the auxiliary walking part to be on the tracks.

9. The overhead traveling vehicle according to claim 1, wherein the auxiliary walking part comprises a walking motor, linkage shafts and auxiliary walking wheels, and wherein the walking motor rotates to drive the linkage shafts to rotate, and the rotation of the linkage shafts drives the auxiliary walking wheels to rotate.

10. An overhead traveling vehicle fault processing system, comprising:
an overhead traveling vehicle, comprising:
an overhead traveling vehicle main body;
a main walking part, installed on the overhead traveling vehicle main body and configured to drive the overhead traveling vehicle main body to walk on tracks;
an auxiliary walking part, installed on the overhead traveling vehicle main body and configured to drive the overhead traveling vehicle main body to walk on the tracks; and
a control part, configured to control one of the main walking part and the auxiliary walking part to be on the tracks and to control the other one of the main walking part and the auxiliary walking part to leave the tracks;
a fault detector, configured to detect a fault of the main walking part; and
a processor, configured to send a control signal to the control part responsive to that the fault detector detects a fault, so that the control part controls the auxiliary walking part to be on the tracks and controls the main walking part to leave the tracks.

11. The overhead traveling vehicle fault processing system according to claim 10, wherein the control part comprises a first control part configured to control the auxiliary walking part to be on the tracks or to control the auxiliary walking part to leave the tracks.

12. The overhead traveling vehicle fault processing system according to claim 11, wherein the first control part comprises first lifting parts, which are installed on front and rear sides of the overhead traveling vehicle main body in a walking direction along the tracks, the first lifting part is connected with the auxiliary walking part, and a distance of a joint of the first lifting part with the auxiliary walking part and the tracks is variable, so that the auxiliary walking part is on the tracks or leaves the tracks.

13. The overhead traveling vehicle fault processing system according to claim 12, wherein the first lifting part comprises a first lifting driver and a first adjusting part, the first lifting driver is connected with the first adjusting part, and the first adjusting part is connected with the auxiliary walking part, and wherein the first lifting driver adjusts a position or a shape of the first adjusting part, so as to enable the auxiliary walking part to be on the tracks and enable the main walking part to leave the tracks, or enable the auxiliary walking part to leave the tracks and enable the main walking part to be on the tracks.

14. The overhead traveling vehicle fault processing system according to claim 10, wherein the control part comprises a second control part configured to control the main walking part to be on the tracks or to control the main walking part to leave the tracks.

15. The overhead traveling vehicle fault processing system according to claim 14, wherein the second control part comprises a second lifting part installed on the overhead traveling vehicle main body and connected with the main walking part, and wherein a distance between a joint of the second lifting part with the main walking part and the tracks is variable, so that the main walking part is on the tracks or leaves the tracks.

16. The overhead traveling vehicle fault processing system according to claim 15, wherein the second lifting part comprises a second lifting driver and a second adjusting part, the second lifting driver is connected with the second adjusting part, and the second adjusting part is connected with the main walking part, and wherein the second lifting driver adjusts a position or a shape of the second adjusting part, so as to enable the main walking part to be on the tracks and enable the auxiliary walking part to leave the tracks, or enable the main walking part to leave the tracks and enable the auxiliary walking part to be on the tracks.

17. The overhead traveling vehicle fault processing system according to claim 10, wherein the auxiliary walking part comprises a walking motor, linkage shafts and auxiliary walking wheels, and wherein the walking motor rotates to drive the linkage shafts to rotate, and the rotation of the linkage shafts drives the auxiliary walking wheels to rotate.

* * * * *